United States Patent [19]

Missout et al.

[11] Patent Number: 4,629,979

[45] Date of Patent: Dec. 16, 1986

[54] APPARATUS FOR SENSING AND MEASURING A CURRENT ON POWER TRANSMISSION LINE

[75] Inventors: Gilles Missout, St. Bruno; Marcel Déry, Varennes, both of Canada

[73] Assignee: Hydro-Quebec, Quebec, Canada

[21] Appl. No.: 528,063

[22] Filed: Aug. 31, 1983

[51] Int. Cl.[4] ............ G01R 1/20; H05K 9/00; H01C 5/00

[52] U.S. Cl. ................... 324/126; 174/35 R; 338/49; 361/424

[58] Field of Search ............ 324/126, 127, 102; 338/49; 307/89, 90, 91; 333/12; 174/35 R; 361/424

[56] References Cited

U.S. PATENT DOCUMENTS

| | | | |
|---|---|---|---|
| 2,502,657 | 4/1950 | Lindenbald | 324/126 |
| 3,428,896 | 2/1969 | Schweitzer, Jr. | 324/126 |
| 4,122,416 | 10/1978 | Oblak et al. | 361/424 |
| 4,374,359 | 2/1983 | Missout | 324/126 |

Primary Examiner—Ernest F. Karlsen
Attorney, Agent, or Firm—Oblon, Fisher, Spivak, McClelland & Maier

[57] ABSTRACT

An apparatus for sensing and measuring a DC or AC current on an LV or HV power circuit. The apparatus comprises a shunt element having an input connected to the transmission line. The current flowing through the shunt is measured by an electronic circuit which is located in a conductive housing connected in series with the shunt element. The housing conducts the current from the shunt back to the power circuit. The housing is dimensioned to contain therein the electronic circuit whereby to shield the circuit from thermal effects of the shunt element, the magnetic field effect of the measured current, and environmental electrostatic interference.

12 Claims, 6 Drawing Figures

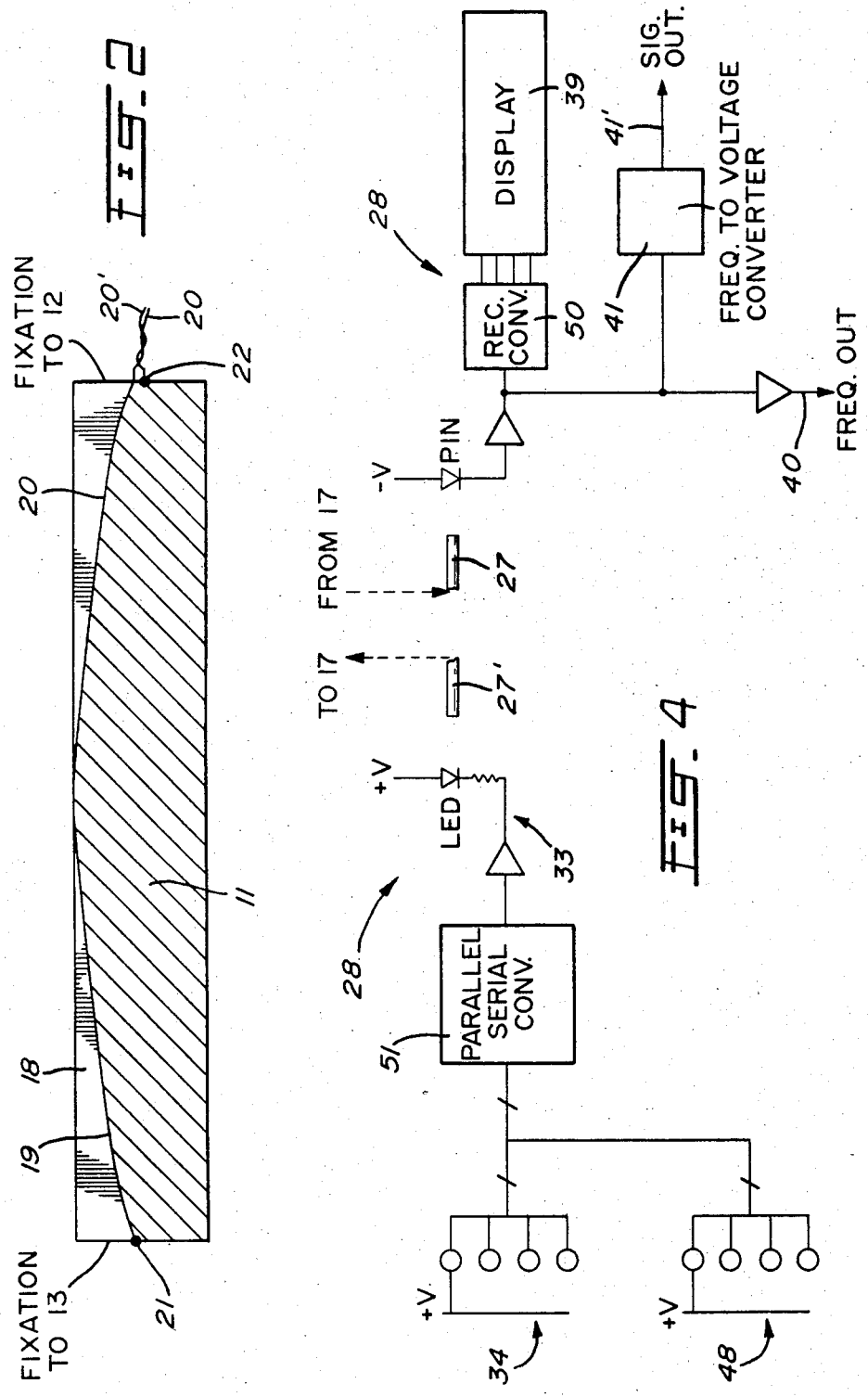

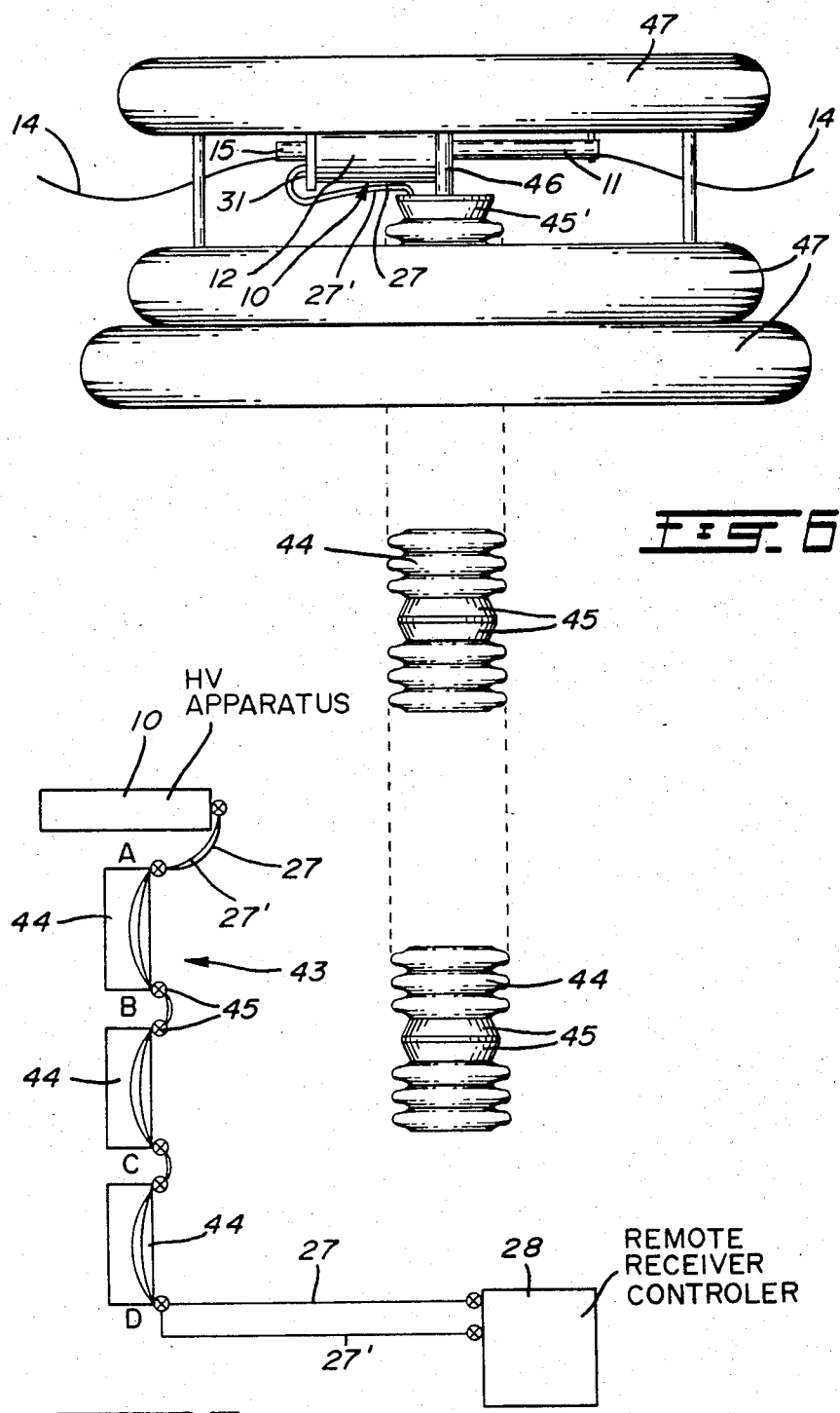

APPARATUS FOR SENSING AND MEASURING A CURRENT ON POWER TRANSMISSION LINE

BACKGROUND OF THE INVENTION (a) Field of the Invention

The present invention relates to an apparatus for sensing and measuring a current on a power circuit and comprising a shunt element and a conductive housing connected in series therewith, the housing being dimensioned to contain a transmission circuit to measure the current flowing through the shunt and to transmit the information to a remote station.

(b) Description of the Prior Art

Reference is made to Applicant's U.S. Pat. No. 4,374,359 issued Feb. 15, 1983 to the assignee of the present application and wherein there is disclosed and claimed a co-axial shunt wherein the electronic circuitry is located in a chamber internally of the shunt. Such a structure requires that current flow in a co-axial manner in the shunt wherein the inner chamber is not subjected to the effects of the magnetic field casued by the current flow in the shunt. However, an inconvenience of such structure is that the ambient temperature in the chamber greatly increases, particularly in warm climatic conditions,and affects the proper operation of the electronic components within the circuits located in the chamber.

In standard co-axial shunts used for measuring currents of 1 kA to 100 kA or over, great care is required at the installation stage to ensure that the output voltage originates from the resistive part of the shunt and not from the strayed magnetic coupling between the measured current and the shielded conductor carrying the low voltage to the conditioning amplifier. This constitutes a basic limitation in the use of such shunts since the cable carrying the information signals has to pass by the end of the shunt close to the heavy current of the line.

For high voltage transmission line application, these types of shunts are usually mounted at the tope of an insulation column and it is desirable to control the parameters of the electronic circuits located in the shunt from a remote ground station. It is also desirable to transmit the data from the electronic circuit housed in the shunt in a form unaffected by the magnetic field effects of such shunt.

SUMMARY OF THE INVENTION

It is a feature of the present invention to provide an improved apparatus for sensing and measuring a DC or AC current on an LV or HV power circuit and comprising a shunt element in series with a conductive housing for containing therein electronic circuits which are shielded from thermal effects of the shunt element, the magnetic field effect of the measured current, and environmental electrostatic interference.

Another feature of the present invention is to provide an apparatus for sensing and measuring a DC or AC current on an LV or HV power circuit and comprising a shunt element in series with a conductive housing for containing electronic circuit means having a DC power supply therein which is powered by the current flowing through the conductive housing.

Another feature of the present invention is to provide an apparatus for sensing and measuring a DC or AC current on an LV or HV power circuit and comprising a shunt which is constructed of a resistive core and having therein a metal wire for tapping the voltage developed across the shunt by the current flowing therethrough to provide an input signal to a transmission circuit means located in a conductive housing connected in series with the shunt.

According to the above features, from a broad aspect, the present invention provides an apparatus for sensing and measuring DC or AC current on an LV or HV power circuit. The apparatus comprises a shunt element having an input connected to the power circuit. Means is provided for sensing current flowing through the shunt. A conductive housing is connected in series with the shunt element for conducting the current from the shunt back to the transmission line. The housing is dimensioned to contain therein electronic circuit means shielded from the thermal effects of the shunt element, the magnetic field effect of the measured current, and environmental electrostatic interference.

BRIEF DESCRIPTION OF THE DRAWINGS

A preferred embodiment of the present invention will now be described with reference to an example thereof as illustrated in the accompanying drawings, in which:

FIG. 2 is a section view through the shunt element;

FIG. 4 is a schematic view showing a typical remote receiver and control circuit;

FIG. 5 is a schematic illustration of an insulation column having the apparatus mounted at the top thereof and showing the interconnection between the transmission circuit and the receiver circuit, and FIG. 6 is a fragmented side view showing the location of a shunt at the top of an insulation column equipped with ring electrodes.

DESCRIPTION OF PREFERRED EMBODIMENTS

Figure 1:
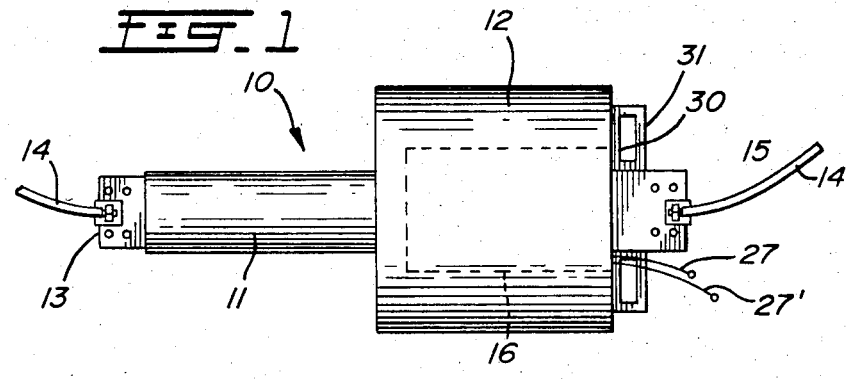
FIG. 1 is a side view of the apparatus of the present invention comprising essentially a shunt, a conductive housing containing therein an electronic circuit.
Figure 3:
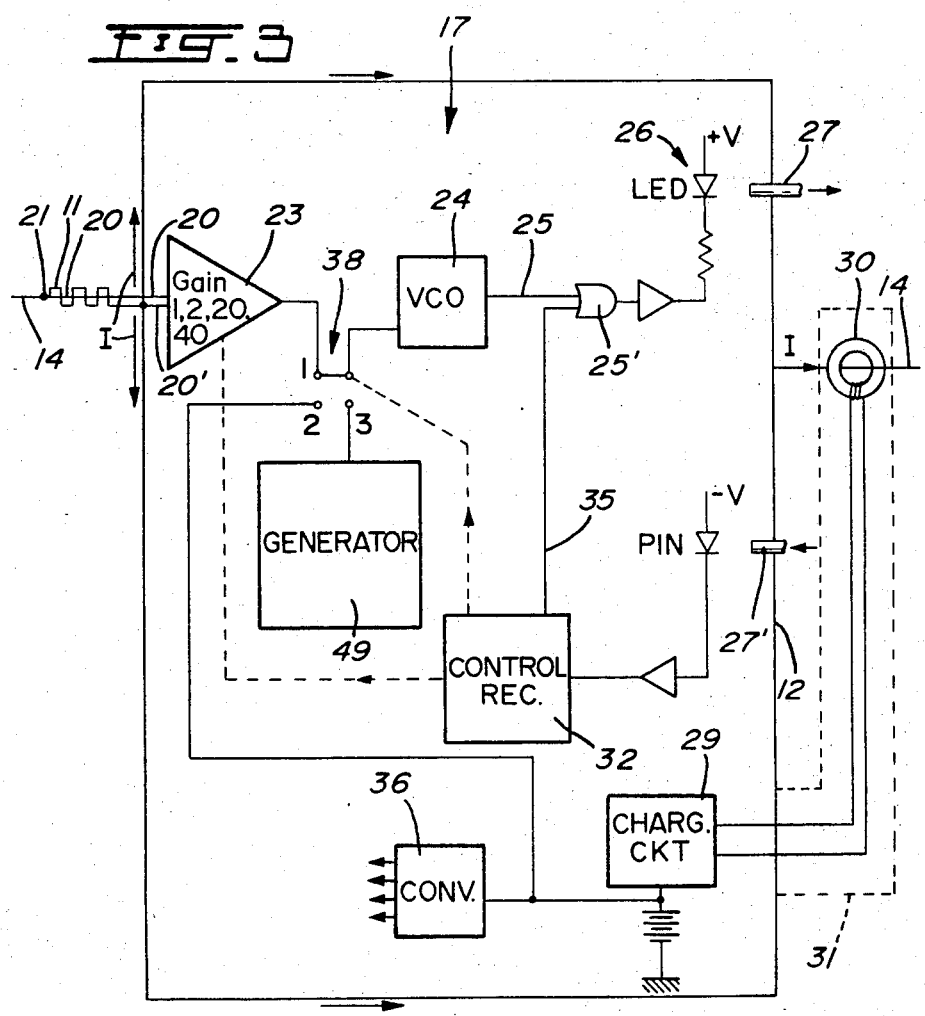
FIG. 3 is a schematic diagram of the electronic circuit located in the conductive housing.

Referring now to the drawings more particularly to FIGS. 1 to 3, there is shown generally at 10 the apparatus of the present invention and comprising a shunt element 11 having a conductive housing 12 connected in series therewith. The shunt 11 is provided with an input connection 13 which is connectible to a power circuit such as a transmission line 14 or an output circuit of a power generator, etc. An output connection 15 is secured to the end of the conductive housing 12 to provide for the output connection of the apparatus 10 to the power circuit. As can be seen, the conductive housing 12 is provided with an internal compartment 16 for housing therein electronic circuits such as shown at 17 in FIG. 3.

The shunt element 11 is a solid resistive core element having a tapping wire 20 extending through the core from tap 21. In order to improve the frequency and/or impulse response of the shunt, a longitudinal slot 18 extends longitudinally throughout the shunt and has a base 19 configured to support the wire 20 thereon along a double parabolic path from the inlet end 21 to the outlet end 22 of the shunt as is known in the art. In this particular embodiment, the shunt is an elongated rod-like member having a circular cross-section and being adapted at its far end with a second tap 22 interconnected with the conductive housing 12, to provide another shunt connection via wire 20'. Both wires 20 and 20' connect to the input of a variable gain amplifier 23, as will be described later with respect to FIG. 3.

For the construction of the shunt it is perferable to have a material which will provide a very small error over a temperature range of operation of the shunt and which is capable of being dimensioned to prevent the formation of excess heat during use. A few materials have been found to possess such qualities and namely, it was found that "Monel K" material provides a resistivity of 58.3 $\mu\Omega$/cm and has a thermal coefficient of 0.00018 $\mu\Omega$.cm/°C. The resistance variation over a temperature range of $-50°$ C. to $+150°$ C. is approximately 3.6%. Also, a material known by the trade mark "Copel" has excellent properties for the construction of the shunt and it has a resistance of approximately 48.7 $\mu\Omega$/cm and a thermal coefficient of $\pm 20 \times 10^{-6}$ $\mu\Omega$cm/°C. Such a material provides an error which is inferior to 1% over the above-mentioned temperature range. It is also noted that in order to minimize the heating of the shunt by the rays of the sun, it may be painted white in order to reflect the rays of the sun.

By locating the conductive housing 12 in series with the shunt it is possible to increase the heat dissipation caused by the current flowing through the shunt and to maintain the electronic circuit inside the housing 12 at a temperature much more inferior to the temperature of the resistive shunt element 11. It is also pointed out that the magnetic field produced by the current flowing through the shunt and the housing 12 is nil at any point inside the chamber 16. Also, seeing that the chamber 16 is totally enclosed within the housing 12 from an electrostatic point of view, the electric field effects are nil.

As shown in FIG. 3, the transmission circuit 17 within the chamber 16 comprises a variable gain amplifier 23 having gains of 40, 20, 2 and 1 thereby permitting to have levels of current of 1 kA, 2 kA, 20 kA and 40 kA, full scale. The resistive value of the shunt is such that the voltage at the output of amplifier 23 is 2.5 volts peak for full scale input. The voltage control oscillator 24 generates an information signal on its output 25 which activates a light emitting diode circuit 26 for the transmission of the signal over an optical fiber line 27. This signal is received at a far end of the line 27 (see FIG. 5) and is fed to a remote receiver circuit 28 where the signal is converted. Also mounted in the housing chamber 16 is a rechargeable DC battery supply circuit 29 fed by the output of a current transformer 30, and a DC to DC converter 36, and a calibration generator 49 which is utilized to guarantee the quality of the output information signal which is representative of the measured current flowing in the shunt element. The current transformer 30 is secured at the output of the housing 12 in an electrostatic shield housing 31.

Referring now to FIG. 4, there is shown the remote receiver and control circuit 28. The circuit has a control function and is capable of generating control signals via push button switches 34 and 48 and parallel to serial converter 51 and a light emitting diode circuit 33, through an optical fiber line 27', to a control receiver 32 located in the transmission circuit 17. The control receiver 32 is connected to switch 38 having selectable connections for normal operation and to monitor the operation of the rechargeable DC battery supply circuit 29 or to use the generator 49 as calibrator. The control receiver 32 also selects, in accordance with signal from switches 48, the desired gain of the variable gain amplifier 23. The switches 34 also provide for a stand-by condition of the transmission circuit 17 so as to limit the power drain of battery supply.

As seen in FIG. 3, the command signal fed to the control receiver 32 is echoed through line 35 to the remote receiver/converter 50 whereby to display on the panel 39 the selected control functions for verification. The echo signal is superimposed at the transmitter, in an OR gate 25', to the signal at the output of the VCO 24 for transmission on the same line 27. The remote receiver 28 also has an output connection 40 to provide a frequency signal representative of the measured current and an output connection 41', through a frequency to voltage converter 41, to provide an analog output signal also representative of the measured current. As shown in FIG. 4, the receiver circuit 28 has a display panel 39 to display the functions programmed in the transmitter 17. The receiver also provides two output connections 40 and 41' to provide an analog output signal or a frequency modulated signal to feed a remote station or a magnetic tape recorder.

FIG. 5 shows a schematic illustration of a typical installation of the apparatus 10 of the present invention. As herein shown the apparatus is mounted at the top of an insulation column 43 which is constructed by porcelain sections 44 which are interconnected together by coupling elements 45. The column sections 44 are hollow sections interconnected by the connectors 45 to provide a sealed inner housing which is filled with a gas, such as dried nitrogen, and pressurized to a pressure of approximately 2 atmosphere. The optical fiber transmission lines 27 and 27' are directed through the porcelain column sections and the end connectors 45 having means (not shown) to interconnect optical fiber transmission line sections.

As shown in FIG. 6 the apparatus is provided with a securing support 46 which is attached to the uppermost connector 45' which seals the top of the column and receives the optical fiber transmission lines 27 and 27'. Torroidal ring electrodes 47 are supported about the top of the column about the shunt apparatus 12 whereby to ensure a uniform distribution of the electric fields about the shunt and the column 43.

It is a feature of the present invention to provide any obvious modifications of the example of the preferred embodiments described herein, provided such modifications fall within the scope of the appended claims. For example, in the transmission circuit 17 described, the VCO 24 may be replaced by an analog to digital converter circuit for the coding of the measured signal to a remote receiver adapted to such coded signal.

We claim:

1. An apparatus for sensing and measuring a DC or AC current on a power circuit, said apparatus comprising a shunt element constructed from a metal having a relatively stable resistance value and very small error over an operating temperature range of said shunt, said shunt element further having an input connection electrically connectable to said power circuit, a conductive housing connected directly to said shunt element and in series therewith for conducting said current from said shunt, said conductive housing having an output connection connectable to said power circuit for conducting current flowing through said shunt back to said power circuit; said housing defining a chamber, an electronic circuit means contained in said chamber and connected to an input tap and an output tap of said shunt element for sensing and measuring DC or AC current flowing through said shunt element; said housing shielding said electronic circuit means from thermal effects of said shunt element, the magnetic field effect of the measured current, and environmental electrostatic interference; said housing having a surface dimension sufficient to increase the heat dissipation caused by the current flowing through the shunt whereby said electronic circuit means is subjected to reduced temperatures much more inferior than the temperatures of said shunt element.

2. An apparatus as claimed in claim 1 wherein said power circuit is a power transmission line.

3. An apparatus as claimed in claim 2 wherein a pair of conductive wires is connected to said taps of said shunt element for tapping the voltage across the shunt developed by the current to be measured.

4. An apparatus as claimed in claim 3 wherein said shunt element is a resistive core element having a longitudinal slot throughout its length for housing one of said wires.

5. An apparatus as claimed in claim 4 wherein said electronic circuit means comprises a transmission circuit having a variable gain amplifier for receiving a current sensed by said wire disposed in said slot of said shunt and providing an output signal representative thereof, a control receiver circuit and a voltage controller oscillator connected to said amplifier to generate an information signal for transmission to a remote receiver controller.

6. An apparatus as claimed in claim 5 wherein said information signal is transmitted to an optical fiber line.

7. An apparatus as claimed in claim 5 wherein said housing further includes a rechargeable DC battery supply for said transmission circuit, said supply being rechargeable by a recharge circuit fed by a current transformer secured to said conductive housing.

8. An apparatus as claimed in claim 5 wherein said remote receiver/controller has an input transmission line for receiving said information signal and a further optical transmission line for transmission of control signals of said transmission circuit to control the gain of said variable gain amplifier, to verify said battery supply, to operate a calibrator circuit and to place the transmission circuit on stand-by.

9. An apparatus as claimed in claim 5 or 8 wherein said control receiver feeds back echoes of said control signals back to said remote receiver/controller for displaying said selected control signals whereby to guarantee the accuracy of the conditioning of the transmission circuit.

10. An apparatus as claimed in claim 6 wherein said optical fiber transmission lines extend through an insulating column at the top of which is secured said apparatus.

11. An apparatus as claimed in claim 10 wherein said insulating column is constructed from a plurality of hollow porcelain sections having end connectors for their interconnection and for providing continuity in said optical fibre transmission line, said columns being filled with a gas, such as dry nitrogen and pressurized to a pressure of approximately 2 atmosphere.

12. An apparatus as claimed in claim 2 wherein said power transmission line is an HV or LV power transmission line.

* * * * *